(12) United States Patent
Fujii et al.

(10) Patent No.: US 7,683,402 B2
(45) Date of Patent: Mar. 23, 2010

(54) SEMICONDUCTOR DEVICE AND MANUFACTURING METHOD THEREOF

(75) Inventors: Shinji Fujii, Yokohama (JP);
Kouichirou Inoue, Yokosuka (JP);
Naoto Higuchi, Yokohama (JP); Taisei Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 11/858,173

(22) Filed: Sep. 20, 2007

(65) Prior Publication Data

US 2008/0073728 A1    Mar. 27, 2008

(30) Foreign Application Priority Data

Sep. 22, 2006    (JP) .............................. 2006-257750

(51) Int. Cl.
*H01L 29/41*   (2006.01)
*H01L 29/423*  (2006.01)

(52) U.S. Cl. ............... 257/202; 257/213; 257/E29.112; 257/E29.126; 257/E29.127

(58) Field of Classification Search ................. 257/202, 257/213, E29.112, E29.126, E29.127
See application file for complete search history.

(56) References Cited

U.S. PATENT DOCUMENTS

| | | | | |
|---|---|---|---|---|
| 4,988,147 A | * | 1/1991 | Zirps | ....................... 303/116.4 |
| 7,064,380 B2 | * | 6/2006 | Fukumura et al. | ............ 257/315 |
| 2005/0116295 A1 | * | 6/2005 | Mayer et al. | ................. 257/354 |
| 2006/0163656 A1 | * | 7/2006 | Rim | ............................ 257/350 |
| 2007/0187691 A1 | * | 8/2007 | Lee et al. | ....................... 257/72 |

FOREIGN PATENT DOCUMENTS

JP    2000-077531    3/2000

OTHER PUBLICATIONS

Takeuchi et al, A Novel Robust Optimization Method of Exposure and Mask Conditions for Beyond 65 nm-node Lithography, Proceeding of SPIE, 2005, vol. 5853, pp. 265.

* cited by examiner

*Primary Examiner*—Victor A Mandala
(74) *Attorney, Agent, or Firm*—Turocy & Watson, LLP

(57) ABSTRACT

Semiconductor devices whose current characteristics can be prevented from varying even if a phase shift mask is used for patterning gate electrodes of MISFETs, and a manufacturing method thereof are disclosed. According to one aspect of the present invention, there is provided a semiconductor device comprising a first transistor including a first gate electrode provided above a semiconductor substrate, and a first source and a first drain provided in the semiconductor substrate, a second transistor arranged to be adjacent to the first transistor, and including a second gate electrode provided above the semiconductor substrate in parallel with the first gate electrode, and a second source and a second drain provided in the semiconductor substrate, and a third gate electrode provided between the first transistor and the second transistor and in parallel with the first and second gate electrodes.

5 Claims, 10 Drawing Sheets

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2006-257750, filed Sep. 22, 2006, the entire contents of which are incorporated herein by reference.

BACKGROUND OF THE INVENTION

1. Field of the Invention

The present invention relates to a semiconductor device and a manufacturing method thereof, and more particularly a semiconductor device manufactured by using a phase shift mask to control current characteristics and a manufacturing method thereof.

2. Description of the Related Art

As miniaturization of a semiconductor device advances, it is becoming difficult to suppress a variation in feature sizes. In particular, a variation in a patterned gate electrode size of a metal-insulator-semiconductor field-effect transistor (MISFET) is one of the causes of a variation in electrical characteristics, e.g., a current driving force of the MISFET. In order to suppress this variation, improvement in, e.g., a resolution and/or depth of focus (DOF) of lithography, is demanded.

One of methods of improving performance of lithography is a method of using a phase shift mask, e.g., a Levenson mask (an alternating-phase shift mask). In the Levenson mask, usually, a phase of light transmitted through a pair of opening portions adjacent to each other is shifted 180°, namely, a phase is inverted each other, to improve a critical resolution or a depth of focus. The phase inverted pattern arrangement is called a Levenson arrangement, in which the phases are expressed by using 0 and $\pi$.

However, in an actual pattern of the Levenson mask used in manufacturing a semiconductor device, patterns adjacent to each other do not have a desired Levenson arrangement, e.g., an arrangement of 0, $\pi$, 0, $\pi$, but has an arrangement of an inversed phase, i.e., $\pi$, 0, $\pi$, 0, . . . , in some cases. Jpn. Pat. Appln. KOKAI Publication No. 2000-77531 discloses a semiconductor device, which has both patterns of isolated patterns and line-and-space patterns, manufactured by using a mask pattern having the Levenson arrangement. In this technology, a pair of the two patterns is determined as one active region, and the active regions adjacent to each other are arranged in staggered manner, thereby realizing a mask pattern of the Levenson arrangement.

When using the Levenson mask in gate electrode patterning, it is general to invert a phase of light to 0 and $\pi$ or to $\pi$ and 0 on a source side and a drain side of a gate electrode. FIGS. 12A to 12D are views showing examples of correlation of a layout pattern and a Levenson mask pattern arrangements of each MISFET. In the figures, the layout pattern of the gate electrode G is shown by a pattern with solid oblique lines and the Levenson mask patterns Sm and Dm are shown by patterns with broken oblique lines. Referring to FIG. 12A, an example where two MISFETs are vertically arranged will now be considered. In one MISFET, a source S is provided on a left-hand side of the gate electrode G and a drain D is provided on a right-hand side to interpose the gate electrode G therebetween. The gate electrodes G of the two MISFETs are connected with each other through a contact region. A Levenson mask pattern is generally generated automatically by means of computer aided design (CAD) with respect to such a layout pattern. At that time, although processing is carried out in such a manner that a source region (Sm) and a drain region (Dm) of the mask do not have the same phase, one of four combination patterns of 0 and $\pi$ regions such as shown in FIGS. 12A to 12D is generated. That is, in the pattern to be automatically generated, a phase may vary depending on surrounding layout patterns, and one desired pattern, which is any one of the four illustrated patterns, cannot be always generated in a given region.

Although the Levenson mask improves a resolution and DOF of lithography, slight variation in a light transmittance of a 0 region and a $\pi$ region of the mask is caused by a phase shifting processing of the mask. Therefore, the Levenson mask patterns depicted in FIGS. 12A to 12D cannot guarantee that the gate electrodes having completely the same shapes are always patterned. FIGS. 13A and 13B are views for explaining such example. FIG. 13A is a view showing an arrangement of gate electrodes and a Levenson mask pattern, and a $\pi$ region and a 0 region are alternately arranged from the left side to right side with respect to three gate electrodes. FIG. 13B is a view showing shape of gate patterns after patterning the gate electrodes G by using this Levenson mask. As apparent from the drawing, the gate electrode may be patterned into a shape like a bulging rod in such a manner that it bulges from the 0 region toward the $\pi$ region. Such an example is disclosed in "A Novel Robust Optimization Method of Exposure and Mask Conditions for beyond 65 nm-node Lithography" by K. Takeuchi et. al., Proc. of SPIE, Vol. 5853, pp. 265-276, (2005).

BRIEF SUMMARY OF THE INVENTION

According to one aspect of the present invention, there is provided a semiconductor device comprising: a first transistor including a first gate electrode provided above a semiconductor substrate, and a first source and a first drain provided in the semiconductor substrate; a second transistor arranged to be adjacent to the first transistor, and including a second gate electrode provided above the semiconductor substrate in parallel with the first gate electrode, and a second source and a second drain provided in the semiconductor substrate; and a third gate electrode provided between the first transistor and the second transistor and in parallel with the first and second gate electrodes.

According to another aspect of the present invention, there is provided a manufacturing method of a semiconductor device, comprising: forming a gate insulator on a semiconductor substrate; forming a conductor film on the gate insulator; forming a resist film on the conductor film; patterning the resist film with a pattern of gate electrodes including a first gate electrode of a first MISFET, a second gate electrode of a second MISFET, and a third gate electrode disposed between the first and second gate electrodes by using a phase shift mask having a pattern arrangement in which source regions and drain regions of the adjacent first and second MISFETs are disposed alternately and sequentially, the third electrode being disposed between a drain of the first MISFET and a source of the second MISFET; patterning the conductor film to form the first, second and third gate electrodes by using the patterned resist film as a mask; and forming source diffusion layers and drain diffusion layers of the first and second MISFETs in the semiconductor substrate by using the first, second and third gate electrodes as masks.

According to another aspect of the present invention, there is provided a manufacturing method of a semiconductor device, comprising: forming a gate insulator on a semiconductor substrate; forming a conductor film on the gate insulator; forming a resist film on the conductor film; patterning the resist film with a pattern of gate electrodes including a first gate electrode of a first MISFET, a second gate electrode of a second MISFET, and a third gate electrode disposed between the first and second gate electrodes by using a phase shift mask having a pattern arrangement in which the source regions, the gate electrode regions, and the drain regions of the first and second MISFETs are symmetrically arranged each other, respectively, with a third gate electrode region at the center; patterning the conductor film to form the first, second and third gate electrodes by using the patterned resist film as a mask; forming source diffusion layers and drain diffusion layers of the first and second MISFETs in the semiconductor substrate by using the first, second and third gate electrodes as masks; and forming interconnects respectively connecting the source diffusion layers, the drain diffusion layers, and the gate electrodes of the two symmetrically arranged MISFETs each other in parallel.

DETAILED DESCRIPTION OF THE INVENTION

Figure 1:
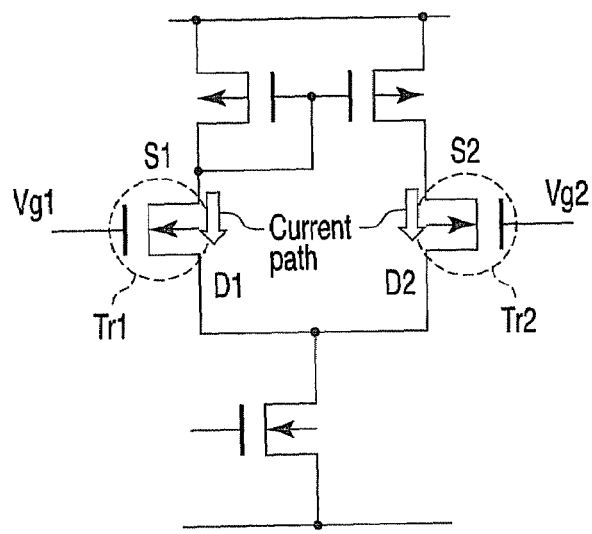
FIG. 1 shows an example of a circuit diagram for explaining a first embodiment of the present invention.

Embodiments according to the present invention disclose semiconductor devices whose current characteristics can be prevented from varying even if a phase shift mask, e.g., a Levenson mask, is used for patterning gate electrodes of MISFETs, and a manufacturing method thereof.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit.

First Embodiment

According to a first embodiment of the present invention, a third gate electrode (a dummy gate electrode) is provided between gate electrodes of a pair of MISFETs adjacent to each other and in parallel with these gate electrodes. As a result, a phase shift mask, e.g., a Levenson mask, which is used to manufacture the gate electrodes of the pair of MISFETs allows source regions or drain regions of the two MISFETs to be patterned to have the same phase. There is provided a semiconductor device in which a variation in current characteristic between the pair of MISFETs is suppressed based on this technology and a manufacturing method thereof.

Figure 13A:
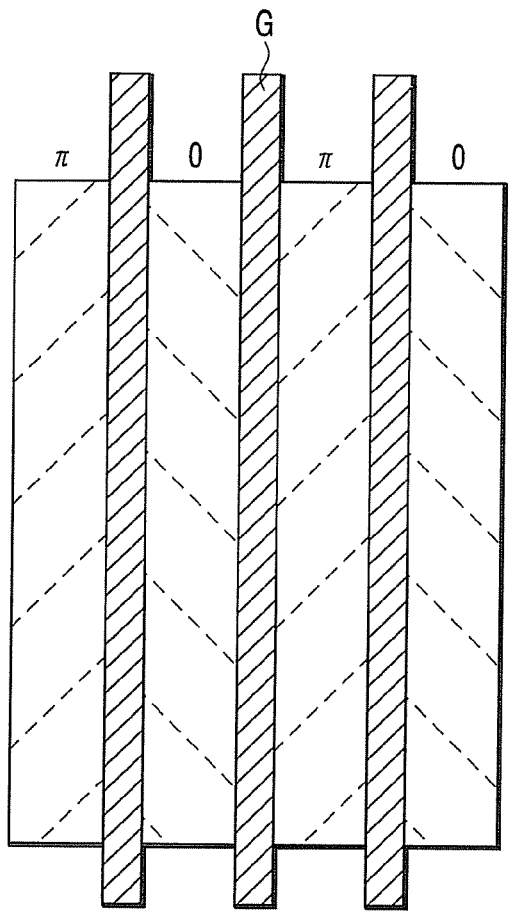
FIG. 13A is a view showing an arrangement of gate electrodes and a Levenson mask pattern.
Figure 13B:
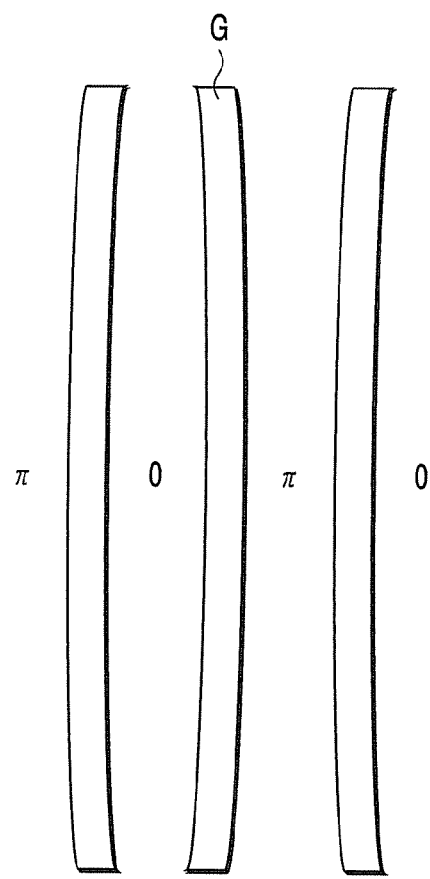
FIG. 13B is a view showing the gate electrodes patterned by using the Levenson mask depicted in FIG. 13A.

As described above, an example where gate electrodes of the MISFET are patterned by using such a Levenson mask as depicted in FIG. 13A based on a conventional technology will be considered. Since there is a difference in light transmittance between a 0 region and a π region of the Levenson mask, each gate electrode G may be patterned into a slightly curved shape as shown in FIG. 13B. As a pattern of the Levenson mask is automatically generated, a source of the MISFET may be formed into either the 0 region or the π region and may not be uniquely formed into one of these regions. As a result, electrical characteristics, e.g., source-drain current characteristics (Ids), may vary depending on a case where the source is formed into the 0 region or the π region.

In a circuit in which matching of characteristics of two or more MISFETs is critical, e.g., a differential amplifier, the above-explained variation in current characteristics of the MISFETs considerably degrade characteristics of the circuit.

FIG. 1 shows an example of a circuit diagram of the differential amplifier, in which each of MISFET 1 (Tr1) and MISFET 2 (Tr2) must have matched current driving forces and difference between gate voltages Vg1 and Vg2 is detected, for explaining the first embodiment. A source and a drain of Tr1 are respectively represented as S1 and D1, and a source and a drain of Tr2 are respectively represented as S2 and D2.

Figure 2:
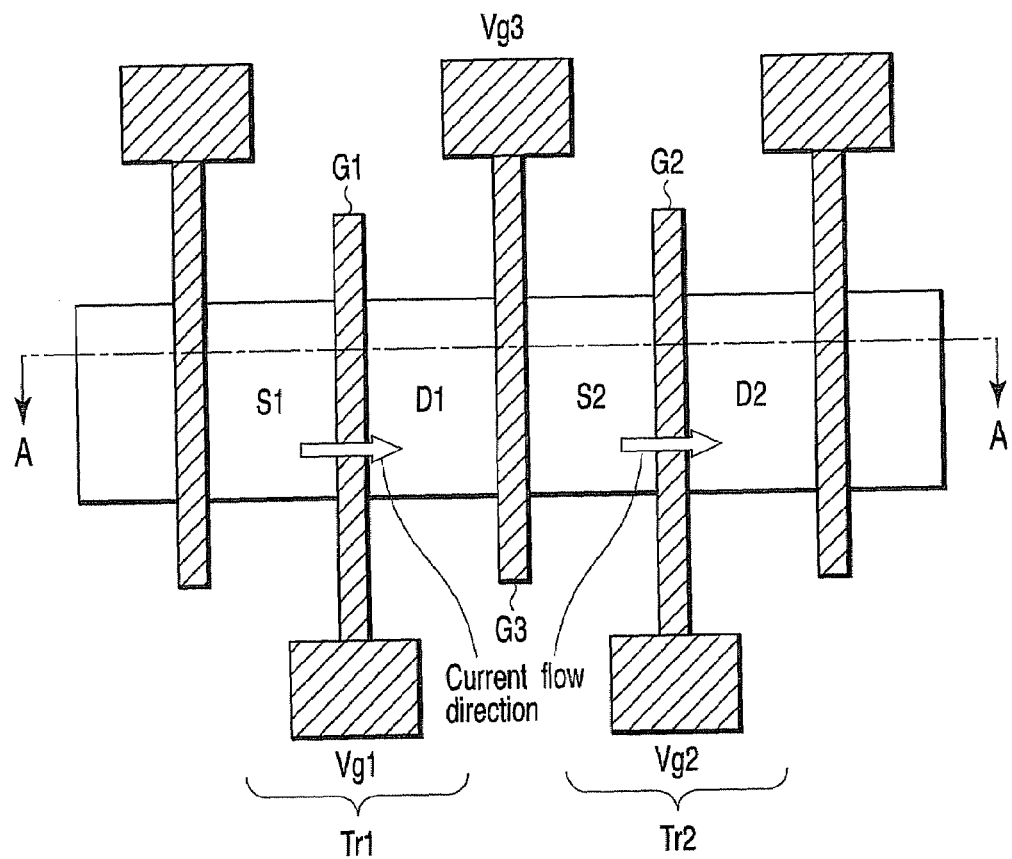
FIG. 2 shows an example of a plan layout chart for explaining a semiconductor device according to the first embodiment.

FIG. 2 shows an example of a plan layout chart of Tr1 and Tr2 according to this embodiment. Tr1 and Tr2 are arranged to be adjacent to each other, and their gate electrodes G1 and G2 are provided in parallel with each other. A third gate electrode G3 is provided between the two gate electrodes G1 and G2 in parallel. As will be explained later in detail, the third gate electrode G3 is a dummy gate electrode which is used to automatically generate a phase shift mask, e.g., a Levenson mask. Sources and drains of the respective MISFETs Tr1 and Tr2 are arranged in the order of a source S1, a drain D1, a source S2, and a drain D2 to interpose one of the three gate electrodes G1, G3, and G2 therebetween. It is to be noted that a gate voltage Vg3 which electrically separates drain D1 and source S2 from each other is applied to gate electrode G3. That is, gate voltage Vg3 is a voltage which prevents a depletion layer or an inversion layer which electrically connects drain D1 and source S2 with each other from being formed in a semiconductor substrate below the gate electrode 3.

When the gate electrodes, the sources, and the drains are arranged in this manner, a mask with a Levenson arrangement having matched phases of the source regions and the drain regions can be formed even if a Levenson mask for patterning the gate electrodes is automatically generated. That is, two source regions Sm1 and Sm2 are generated to have the same phase on the mask uniquely. Likewise, two drain regions Dm1 and Dm2 can uniquely have the same phase which is opposite to the phase of the source regions.

Figure 3A:
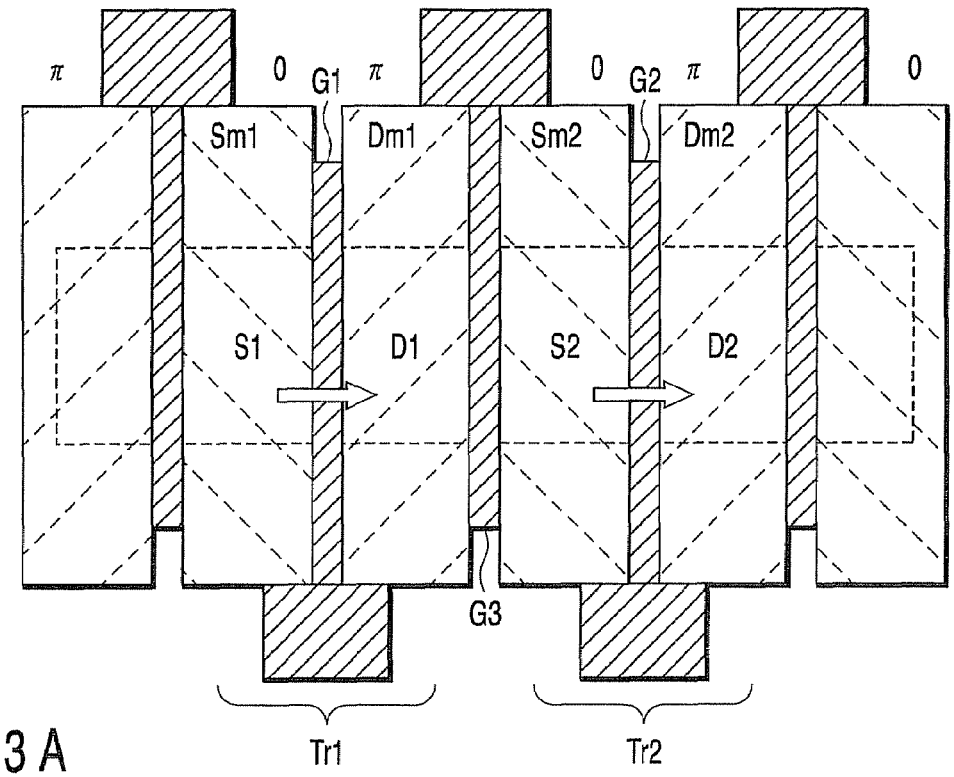
FIGS. 3A and 3B are views in which a Levenson mask pattern is superimposed on the plan layout chart according to the first embodiment.
Figure 3B:
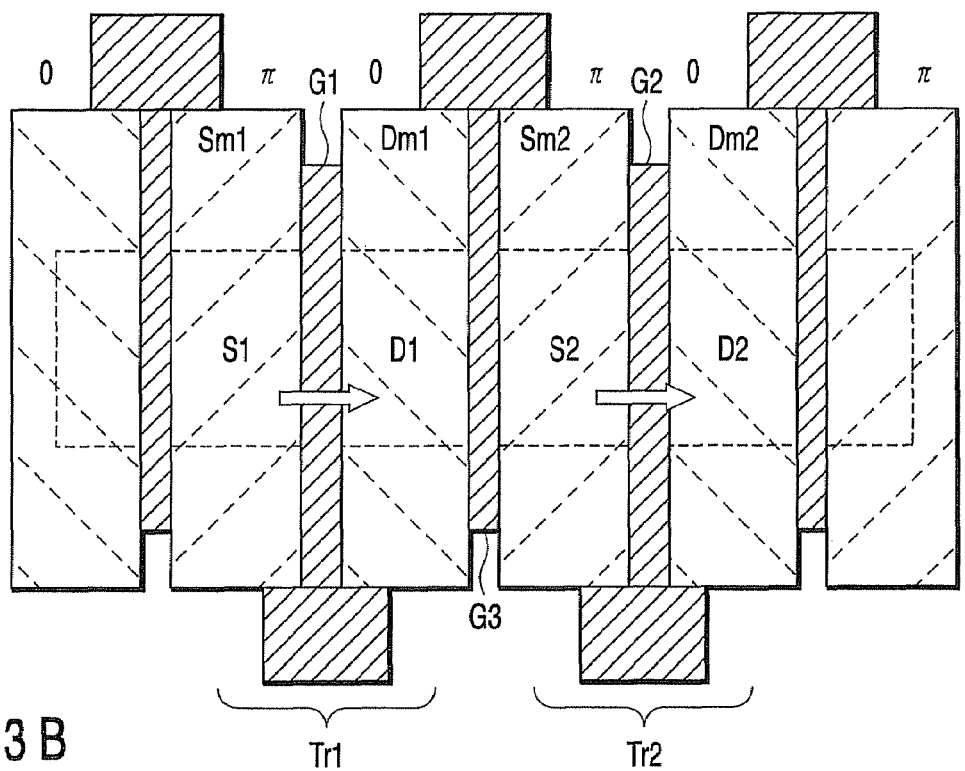

FIGS. 3A and 3B are views in which a pattern of a phase shift mask, e.g., a Levenson mask, is superimposed on a layout pattern of the MISFETs. In the Levenson mask, the 0 region and the π region are alternately arranged to interpose each gate electrode therebetween, thereby realizing a Levenson arrangement. FIG. 3A shows an example where source regions Sm1 and Sm2 of the Levenson mask are the 0 regions and drain regions Dm1 and Dm2 of the same are the π regions. In this case, a source-drain current Ids of the MISFET flows from each 0 region to each π region of the mask in both Tr1 and Tr2 as indicated by arrows. FIG. 3B shows another example where the source regions Sm1 and Sm2 of the Levenson mask are the π regions and the drain regions Dm1 and Dm2 of the same are the 0 regions with phases opposite to those in FIG. 3A. In this case, Ids of the MISFET flows from each π region to the 0 region in both Tr1 and Tr2. As explained above, in both cases, the MISFETs Tr1 and Tr2 have the same current driving force.

Therefore, according to this embodiment, in the two MISFETs, the source regions or the drain regions can uniquely have the same Levenson mask phase. As a result, the source-drain current in each of the two MISFETs Tr1 and Tr2 is uniquely controlled in a direction from the 0 region to the π region or a direction from the π region to the 0 region of the Levenson mask. Accordingly, it is possible to provide a semiconductor device in which a variation in current driving characteristics of the MISFETs caused by distortion to the gate electrode pattern due to a difference in light transmittance between the 0 region and the π region in the Levenson mask is avoided.

Figure 4A:
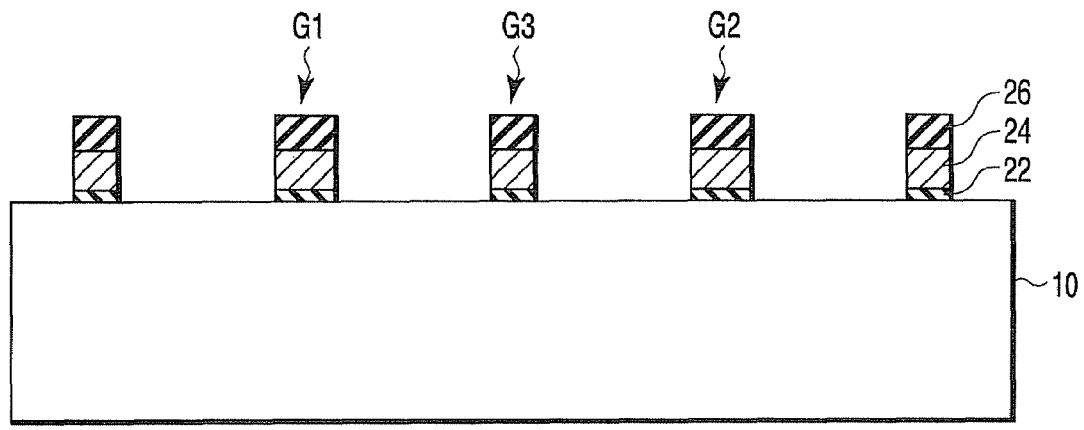
FIGS. 4A and 4B are process cross-sectional views for explaining an example of a manufacturing method of a semiconductor device according to the first embodiment, which are cross-sectional views in a direction cutting across gate electrodes taken along a cutting-plane line A-A depicted in FIG. 2.
Figure 4B:
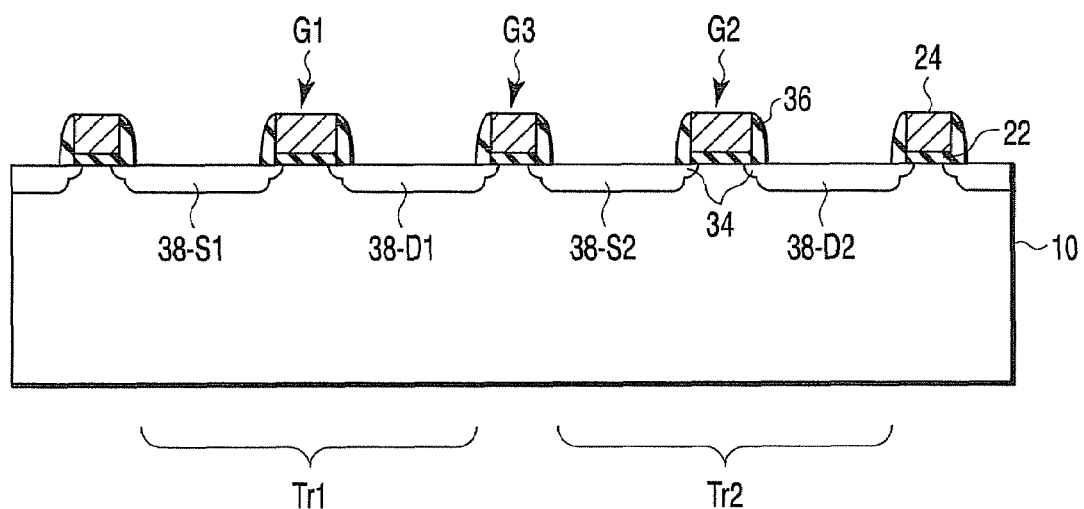
Figure 5:
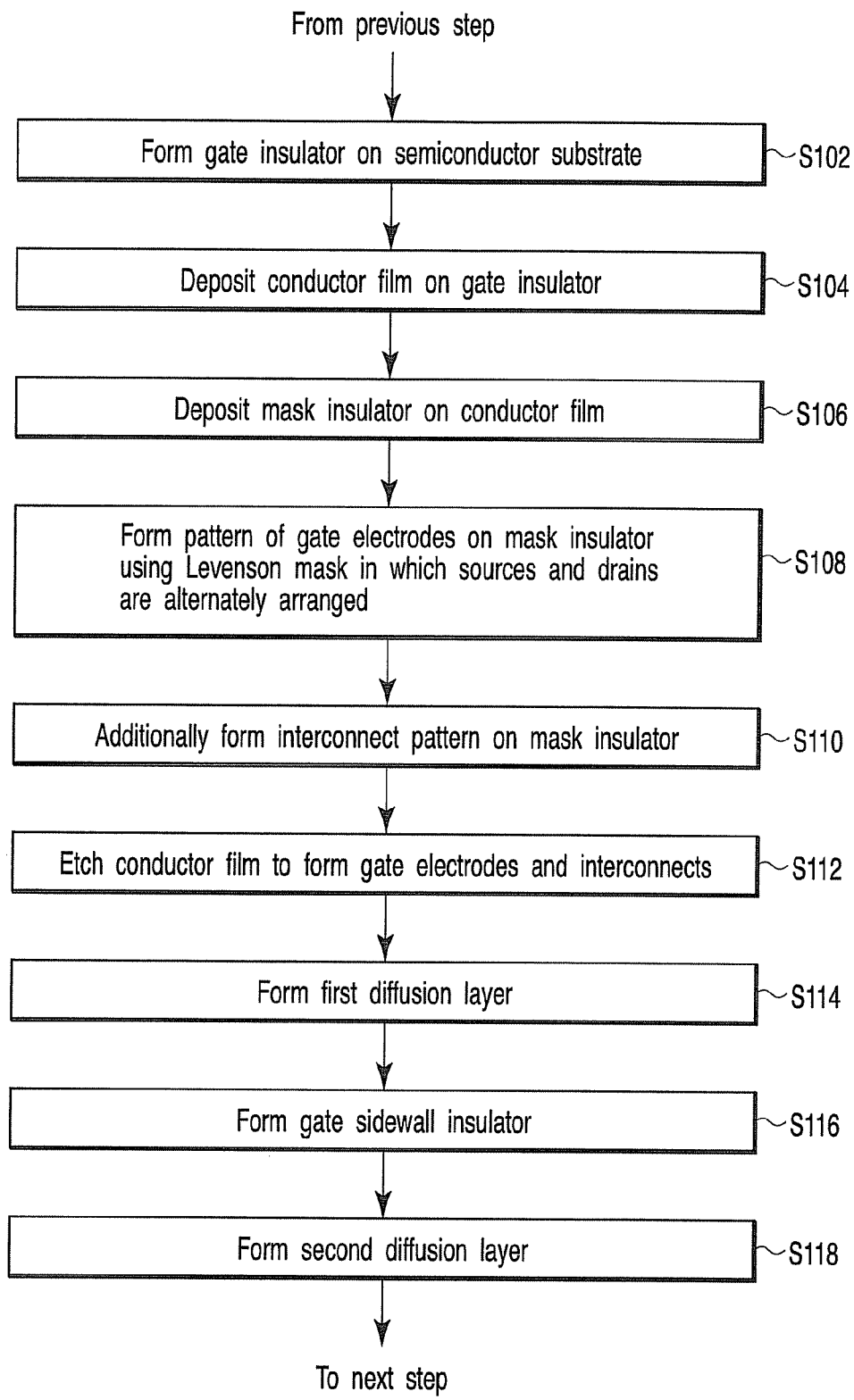
FIG. 5 is a flowchart for explaining an example of the manufacturing method of a semiconductor device according to the first embodiment.

An example of a manufacturing method of a semiconductor device according to this embodiment will now be explained with reference to cross-sectional views of FIGS. 4A and 4B and a manufacture process flowchart of FIG. 5. FIGS. 4A and 4B are cross-sectional views each including two MISFETs in a direction cutting across the gate electrodes taken along a cutting-plane line A-A depicted in FIG. 2. FIG. 5 shows only MISFET manufacturing steps directly related to this embodiment. Each gate electrode can be patterned by using, e.g., a hard mask, a resist mask, or the like. Here, a manufacturing method of using a hard mask to pattern each gate electrode will be taken as an example for explanation.

Before forming each gate electrode, although not shown in FIGS. 4A, 4B, and 5, a well and an isolation are formed in a semiconductor substrate 10, e.g., a silicon substrate. As the isolation, a shallow trench isolation (STI) in which a shallow trench is formed in the semiconductor substrate 10 and an insulator, e.g., a silicon oxide ($SiO_2$) film, is filled therein can be used. An explanation will now be given according to the flowchart of FIG. 5.

Referring also to FIG. 4A, in step S102, a gate insulator 22 is formed on a surface of the semiconductor substrate 10. As the gate insulator 22, an $SiO_2$ film formed by, e.g., thermally oxidizing the silicon substrate 10, can be used, for example. In step S104, a conductor film 24, which is patterned into a gate electrode in a later step, is formed on an entire surface of the gate insulator 22. As the conductor film 24, a polycrystal silicon film deposited by chemical vapor deposition (CVD) can be used, for example. In step S106, a mask insulator 26 is formed on an entire surface of the conductor film 24. The mask insulator 26 is used as a hard mask in patterning of the gate electrode performed later. As the mask insulator 26, a silicon nitride ($Si_3N_4$) film deposited by CVD can be used, for example.

In step S108, a first resist film (not shown) is formed on the mask insulator 26. Then, a pattern of each gate electrode G is formed on the first resist film by lithography using a Levenson mask having a Levenson arrangement in which source regions and drain regions are alternately arranged as depicted in FIG. 3A or 3B. Using the Levenson mask, the part of each gate electrode G which needs to be patterned with a minimum feature size is only patterned. The first resist film is used as a mask to etch the mask insulator 26 by, e.g., reactive ion etching (RIE), thereby transferring the pattern of each gate electrode G thereto. Then, the first resist film is removed.

Although not shown in FIG. 4A, in step S110, a second resist film is formed on the entire surface. Patterns of interconnects, contact pads of the gate electrodes, and others, which are to be patterned on the conductor film 24, are formed on the second resist film. Since these patterns do not need to be finely patterned like the gate electrodes, the patterns can be formed by conventional lithography which does not use a phase shift mask. In this patterning, the pattern of the gate electrodes formed in step S108 is covered with the second resist film. The second resist film is used as a mask to etch the mask insulator 26 by, e.g., RIE, and the patterns of the interconnects are additionally transferred to the mask insulator 26.

In step S112, the mask insulator 26 is used as a mask, and etching is carried out by, e.g., RIE, thereby forming the gate electrodes G, the interconnects, and others on the conductor film 24. In this manner, the structure depicted in FIG. 4A is formed. As shown in the drawing, a third gate electrode G3 is formed between the gate electrodes G1 and G2 of the two MISFETs.

Thereafter, the mask insulator 26 is removed by, e.g., wet etching. The gate electrodes G are used as a mask to introduce a dopant, e.g., arsenic (As), into the silicon substrate 10 by, e.g., ion implantation, thereby forming a first diffusion layer 34 of the source/drain (step S114). An insulator 36, e.g., an $Si_3N_4$ film is deposited to cover the entire surface, and etching back of the insulator 36 is carried out by RIE to form a sidewall insulator 36 on a side surface of each gate electrode G (step S116). Moreover, the gate electrodes G and the sidewall insulator 36 are used as a mask to ion-implant a dopant, e.g., arsenic (As), thereby forming a second diffusion layer 38 of the source/drain (step S118). The second diffusion layer 38 has a concentration higher than that of the first diffusion layer 34 and also has a deeper junction depth.

In this manner, the structure of the MISFET according to this embodiment depicted in FIG. 4B can be formed.

Then, a semiconductor device according to this embodiment is brought to completion through steps required for the semiconductor device, e.g., multilevel interconnections.

In the thus formed two MISFETs Tr1 and Tr2 adjacent to each other, a source 38-S1, a drain 38-D1, a source 38-S2, and a drain 38-D2 of Tr1 and Tr2 are sequentially arranged. In other words, the sources 38-S1 and 38-S2 or the drains 38-D1 and 38-D2 are formed with the same Levenson mask phase. As a result, the two MISFETs Tr1 and Tr2 have the same current driving force, thereby realizing matching.

Although the manufacturing method of using the hard mask to pattern the gate electrodes has been explained in this embodiment, a modification can be carried out to use a resist mask for manufacture like a second embodiment which will be explained next.

Therefore, according to the embodiment, there is provided a semiconductor device in which a variation in current driving characteristics of the MISFETs caused by distortion in the gate electrode shape due to a difference in transmittance between the 0 region and the π region of the phase shift mask, e.g., a Levenson mask, is avoided, and a manufacturing method thereof.

Second Embodiment

According to the second embodiment of the present invention, a dummy gate electrode is arranged at a center of a cell constituted of a pair of MISFETs, and sources and drains of the pair of MISFETs are symmetrically arranged with the dummy gate electrode as a symmetric axis. The pair of MISFETs are electrically connected in parallel, thereby providing a semiconductor device in which a variation in current characteristics among a plurality of the pairs of MISFETs is suppressed and a manufacturing method thereof.

Figure 6:
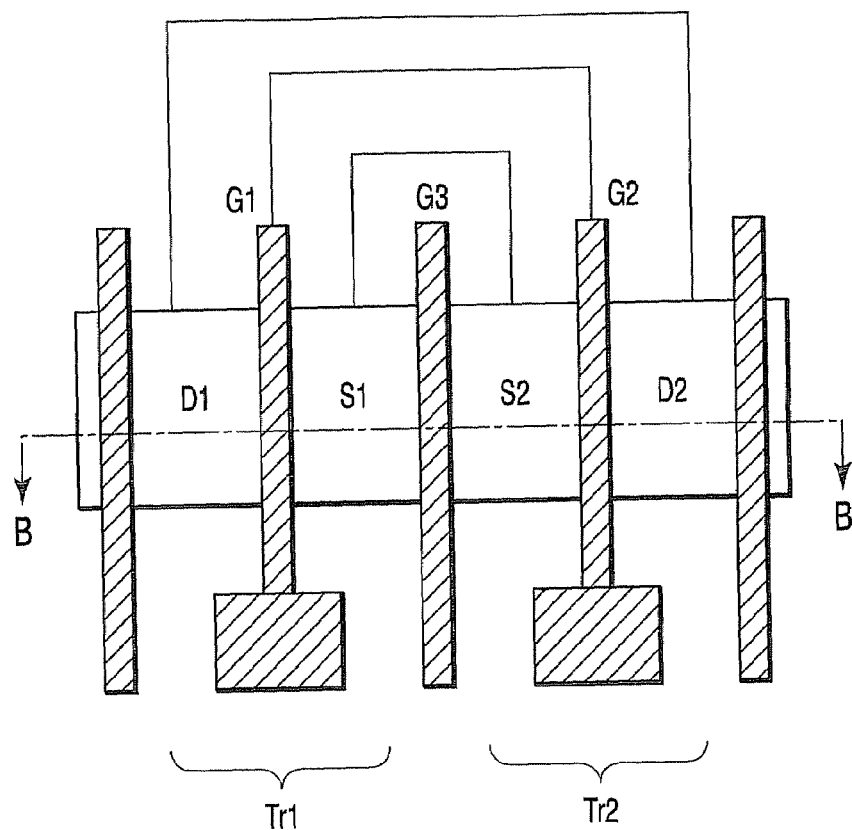
FIG. 6 shows an example of a plan layout chart for explaining a semiconductor device according to a second embodiment of the present invention.

FIG. 6 is a plan view showing an example of a semiconductor device for explaining this embodiment. As shown in the drawing, two MISFETs Tr1 and Tr2 are arranged to interpose a third gate electrode G3 as a dummy gate electrode therebetween, and sources S1 and S2, gate electrodes G1 and G2, and drains D1 and D2 are symmetrically arranged in the mentioned order from the inner side, for example. The sources, the drains, and the gate electrodes are respectively connected with each other through, e.g., metal interconnects, and the two MISFETs are electrically connected with each other in parallel.

Figure 7A:
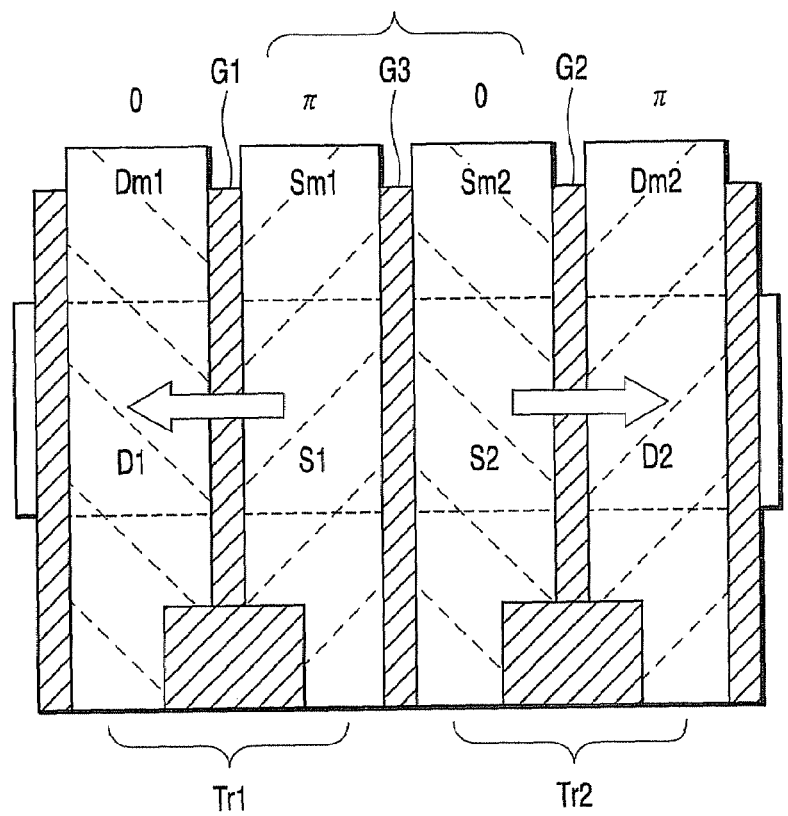
FIGS. 7A and 7B are views in which a Levenson mask pattern is superimposed on a plan layout chart according to the second embodiment.
Figure 7B:
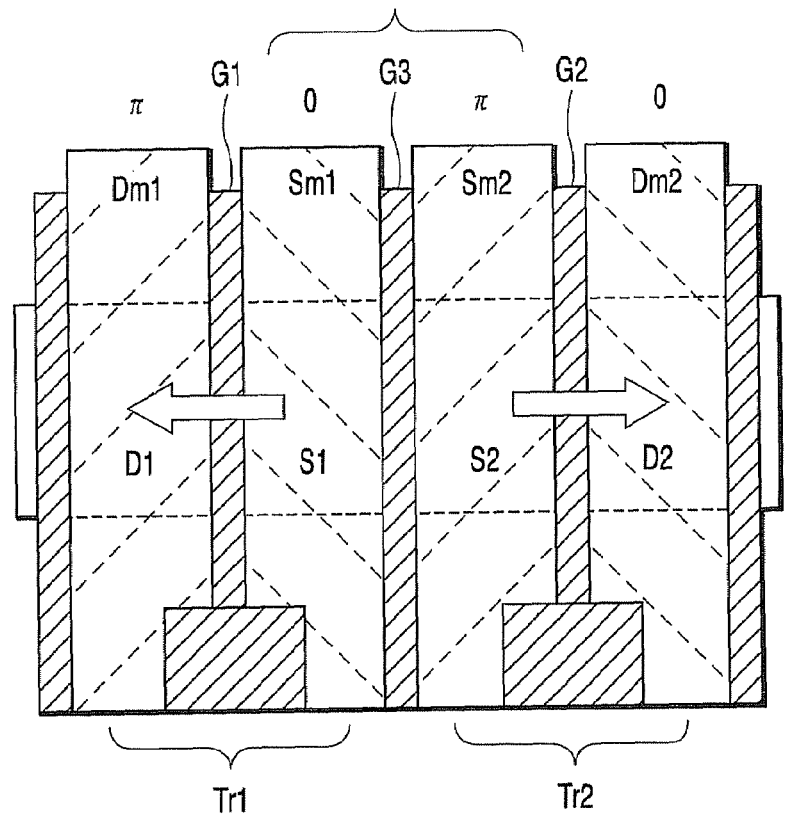

Each of FIGS. 7A and 7B shows an example of a phase shift mask pattern, e.g., a Levenson mask pattern, which is used to manufacture the above-explained semiconductor device, and there are two types of arrangements. FIG. 7A shows an example where a drain region Dm1 of Tr1, a source region Sm1 of Tr1, a source region Sm2 of Tr2, and a drain region Dm2 of Tr2 respectively correspond with 0, π, 0, and π regions in a Levenson mask in the mentioned order from the left side in the drawing, whereas FIG. 7B shows an example where they respectively correspond with π, 0, π, and 0 regions in the same order. The source regions and the drain regions of two MISFETs have opposite phases. Therefore, current driving force of the pair of MISFETs connected with each other in parallel corresponds to a sum of a current flowing from the 0 region to the π region and a current flowing from the π region to the 0 region. Therefore, even if current driving characteristics of the individual MISFETs differ from each other due to distortion of the gate electrode pattern caused by a difference in transmittance between the 0 region and the π region, a sum of the current driving forces of the pair of MISFETs arranged in this manner is to be constant. Moreover, the current driving forces of a plurality of pairs of such MISFETs are equal to each other.

Such a pair of MISFETs can be used for, e.g., an input element of a flip-flop in an inverter circuit which requires a large current driving force.

Figure 8:
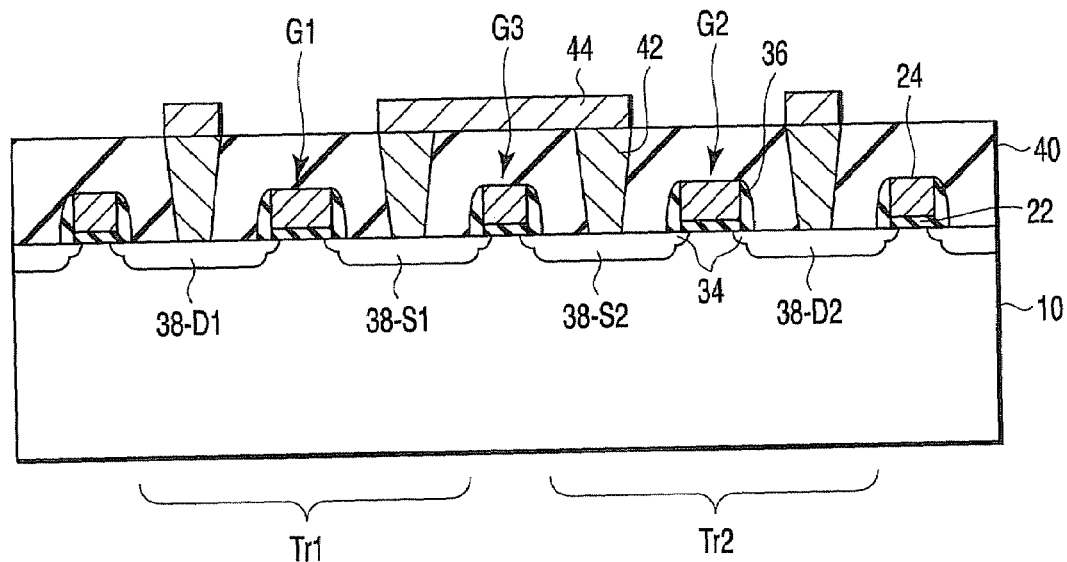
FIG. 8 shows an example of a cross-sectional view for explaining the semiconductor device according to the second embodiment, which is a cross-sectional view in a direction cutting across gate electrodes taken along a cutting-plane line B-B depicted in FIG. 6.
Figure 9:
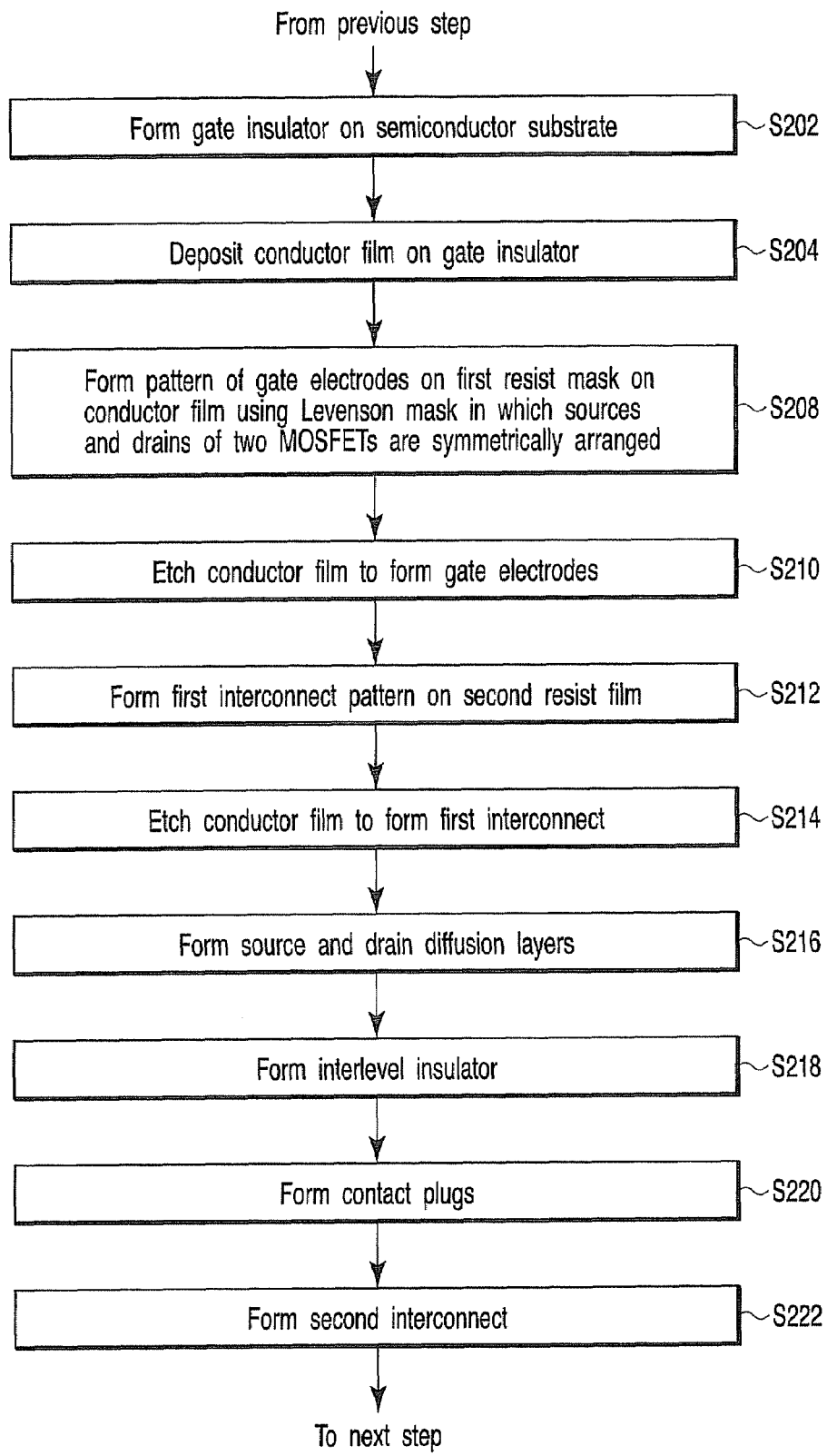
FIG. 9 is a flowchart for explaining an example of a manufacturing method of a semiconductor device according to the second embodiment.

An example of a manufacturing method of a semiconductor device based on this embodiment will now be explained with reference to a cross-sectional view of FIG. 8 and a manufacture flowchart of FIG. 9. FIG. 8 is a cross-sectional view including two MISFETs in a direction cutting across gate electrodes taken along a cutting-plane line B-B depicted in FIG. 6. FIG. 9 shows only manufacturing steps of the MISFET directly related to this embodiment. Here, a manufacturing method of using a resist mask for patterning each gate electrode will be taken as an example for explanation.

Since a first step S202 to a step of depositing a conductor film 24 shown in step S204 in FIG. 9 are the same as the steps S102 to S104 of FIG. 5 according to the first embodiment, an explanation thereof will be omitted.

In step S208, a first resist film (not shown) is formed on the conductor film 24. Then, a Levenson mask having a Levenson arrangement as shown in FIG. 7A or 7B in which the source regions Sm and the drain regions Dm of the two MISFETs Tr1 and Tr2 are symmetrically arranged to interpose a third (dummy) gate electrode G3 therebetween is used to form a pattern of gate electrode G on the first resist film by lithography. Using the Levenson mask, only gate electrodes which need to be patterned with a minimum feature size are patterned.

In step S210, the first resist film is used as a mask to etch the conductor film 24 by, e.g., RIE, thereby forming the gate electrodes G on the conductor film 24. The gate electrodes G having an arrangement where the third gate electrode G3 is arranged between gate electrodes G1 and G2 of the two MISFETs are formed in this manner. Then, the first resist film is removed.

Although not shown in FIG. 8, in step S212, a second resist film is formed on the entire surface and patterns of first interconnects, contact pads of the gate electrodes, and others, which are to be patterned on the conductor film 24, are formed on the second resist film by conventional lithography. In the patterning, the gate electrodes G formed in step S210 are covered with the second resist film.

In step S214, the second resist film is used as a mask to etch the conductor film 24 by, e.g., RIE, thereby forming the first interconnects, the contact pads of the gate electrodes, and others on the conductor film 24. In the etching, the gate electrodes G are not etched since they are covered with the second resist film. Then, the second resist film is removed.

In step S216, first and second diffusion layers 34 and 38 serving as sources/drains are formed in the semiconductor substrate 10 and a sidewall insulator 36 on side surfaces of the gate electrodes G are formed through processes, for example, from steps S114 to S118 according to the first embodiment.

In step S218, an interlevel insulator 40 is formed on the entire surface to cover the gate electrodes G, and the surface is planarized by, e.g., chemical mechanical polishing (CMP). In step S220, contact plugs 42 connected with the sources, the drains, and the first and second gate electrodes are formed in the interlevel insulator 40.

In step S222, second interconnects 44 connected with the contact plugs 42 is formed on the interlevel insulator 40. The second interconnects 44 are formed to electrically connect the sources 38-S1 and 38-S2 with each other, the gate electrodes G1 and G2 with each other, and the drains 38-D1 and 38-D2 with each other, these members being symmetrically arranged with the third gate electrode G3 at the center as described above.

The MISFETs in the semiconductor device according to this embodiment depicted in FIG. 8 can be formed in this manner.

Thereafter, the semiconductor device according to this embodiment is brought to completion through processes required for the semiconductor device, e.g., formation of multilevel interconnects.

In the thus formed two MISFETs Tr1 and Tr2 connected with each other in parallel, a drain 38-D1 and source 38-S1 of Tr1 and a source 38-S2 and drain 38-D2 of Tr2 are symmetrically arranged in the mentioned order with the third gate electrode G3 at the center, for example. In other words, the sources 38-S1 and 38-S2 or the drains 38-D1 and 38-D2 are formed with opposed phases in the Levenson mask. Therefore, in regard to current flow directions from the sources to the drains of the pair of MISFETs according to this embodiment, one is from the 0 region toward the $\pi$ region in the Levenson mask, and the other is from the $\pi$ region toward the 0 region. As a result, a sum of current driving forces of the pair of MISFETs connected with each other in parallel is to be constant, and a plurality of pairs of such MISFETs have the same current driving forces.

Although the sources are arranged on the inner side in the symmetrical arrangement in this embodiment, the drains may be arranged on the inner side. Further, although the manufacturing method of using the resist mask to pattern the gate electrodes has been explained, a modification may be made to use the hard mask for the manufacturing like the first embodiment.

As explained above, according to the embodiments of the present invention, there is provided a semiconductor device in which a variation in current driving characteristics in the MISFETs due to distortion to the gate electrode pattern caused by a difference in transmittance between the 0 region and the $\pi$ region in a phase shift mask, e.g., a Levenson mask, is avoided and a manufacturing method thereof.

(Modification)

In the semiconductor device according to the second embodiment, the sources S1 and S2 formed to interpose the third gate electrode therebetween are electrically connected with each other to operate. Therefore, for example, the sources of the two MISFETs can be formed in one diffusion layer, and thus the semiconductor device can be modified to remove the third gate electrode G3 after patterning the gate electrodes G, for example.

Figure 10:
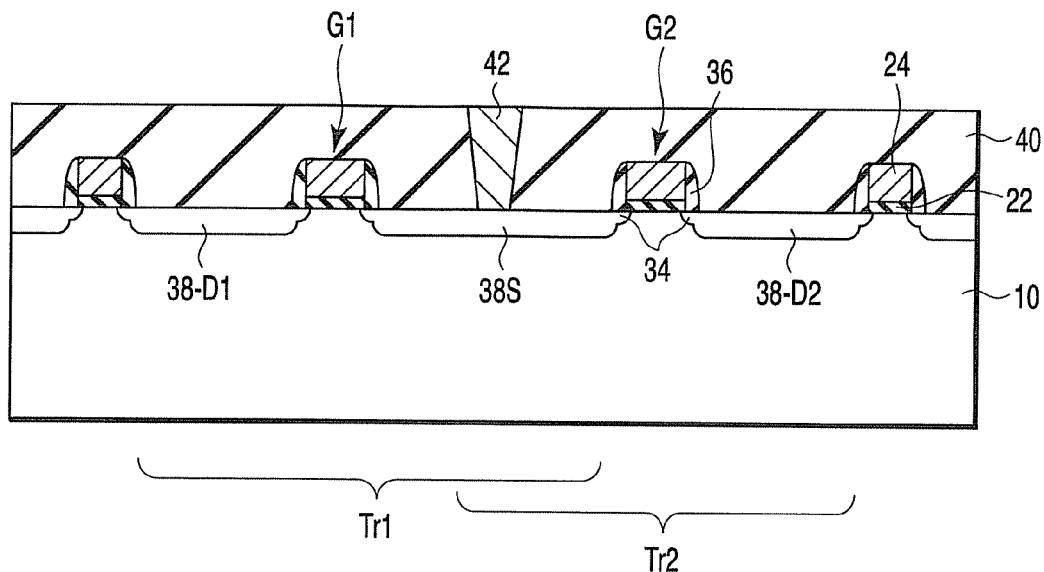
FIG. 10 shows an example of a cross-sectional view for explaining a semiconductor device according to a modification of the present invention.

FIG. 10 is a view showing a cross-sectional structure of a semiconductor device according to an embodiment of this modification. Two MISFETs Tr1 and Tr2 which are arranged to be adjacent to each other and connected in parallel share one source 38-S. As a result, a distance between gate electrodes G1 and G2 can be reduced to be smaller than a distance between the gate electrodes G1 and G2 according to the second embodiment depicted in FIG. 8. Therefore, it can be said that the structure according to this modification is a structure suitable for miniaturization.

Figure 11A:
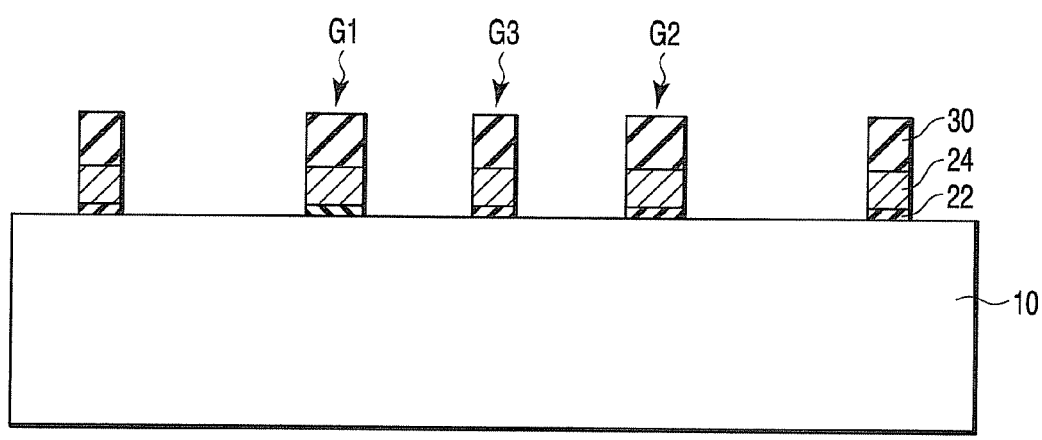
FIGS. 11A and 11B are process cross-sectional views for explaining an example of a manufacturing method of a semiconductor device according to a modification of the present invention.
Figure 11B:
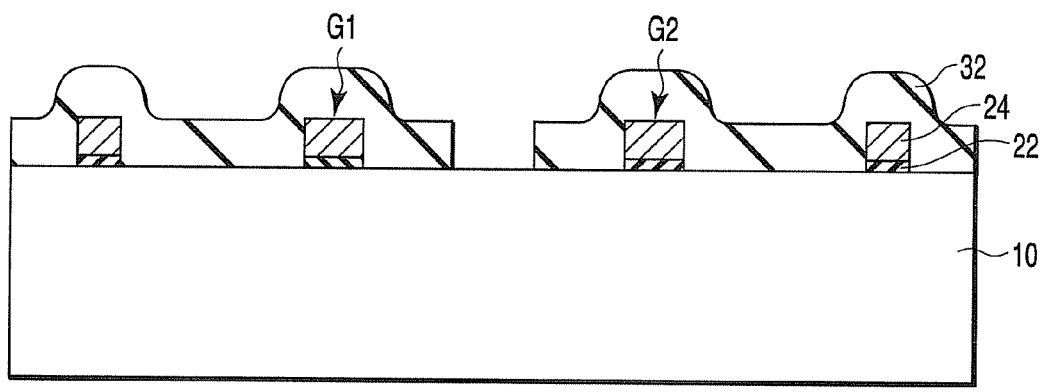
Figure 12D:
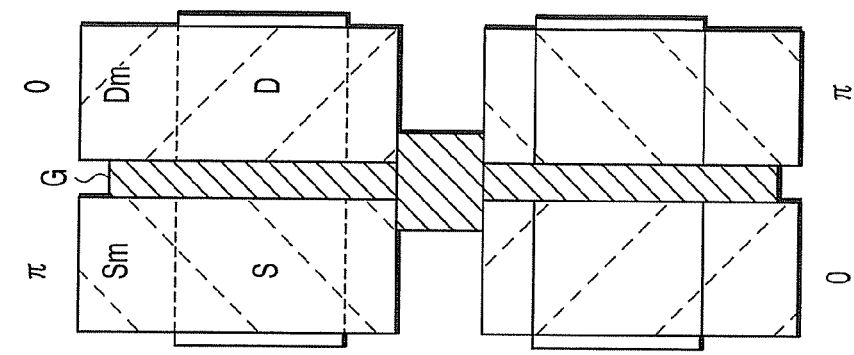
FIGS. 12A to 12D are views for explaining a phase arrangement of a Levenson mask pattern automatically generated by CAD.
Figure 12C:
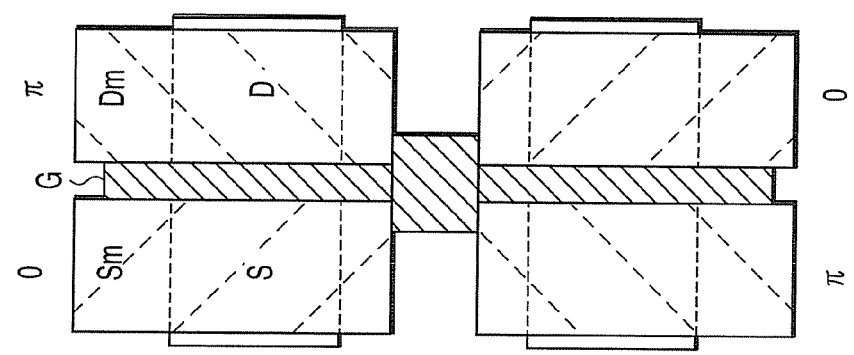
Figure 12B:
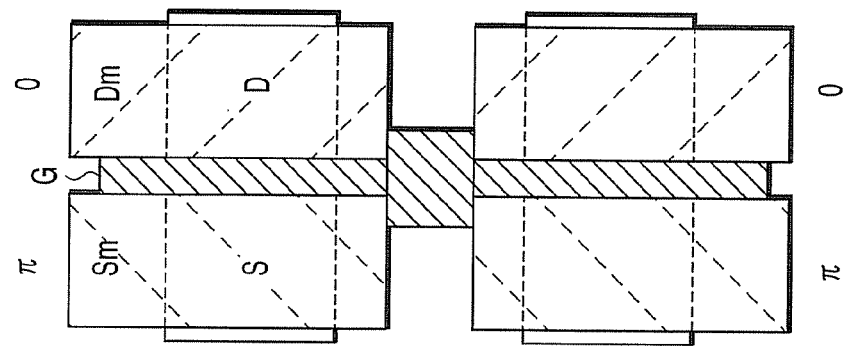
Figure 12A:
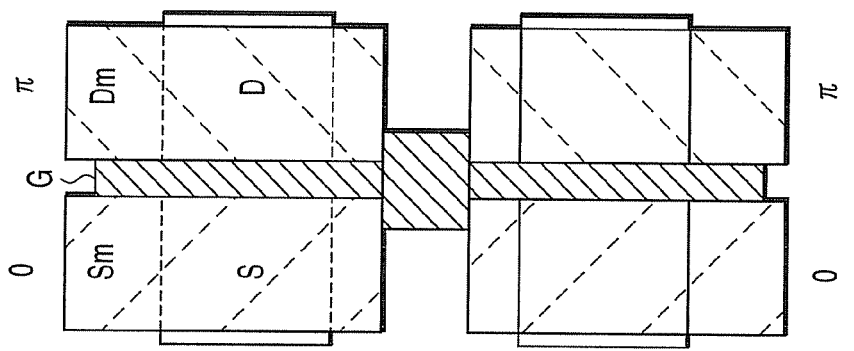

FIGS. 11A and 11B are process cross-sectional views for explaining an example of a manufacturing method of a semiconductor device according to this modification. Since a process flow is substantially the same as that according to the second embodiment depicted in FIG. 9, it will be omitted. Although an example of using a resist mask to pattern gate electrodes will be likewise explained in this modification, the hard mask can be used to perform patterning like the first embodiment.

FIG. 11A is a view showing an example where gate electrodes G are formed by etching like in the step S210 depicted in FIG. 9. In this modification, a first resist film 30 is formed on a conductor film 24 in order to perform etching by using the resist mask. In a Levenson mask used to pattern the gate electrodes G, like the mask depicted in FIG. 7A or 7B, source regions S1 and S2, gate electrodes G1 and G2, and drain regions D1 and D2 of two MISFETs Tr1 and Tr2 are symmetrically arranged from the inner side in the mentioned order with a third gate electrode G3 at the center. In a phase shift mask, e.g., the Levenson mask having such an arrangement, either 0, $\pi$, 0, and $\pi$ regions or $\pi$, 0, $\pi$, and 0 regions are arranged in the mentioned order. Although the source region and the drain region have the same size in the second embodiment, a size of the source region arranged on the inner side can be reduced to approximately one half of that of the drain region, for example, as long as patterning by lithography can be performed with a desired accuracy.

Then, like in the step S212 depicted in FIG. 9, a second resist film 32 is used to form patterns of first interconnects, contact pads of the gate electrodes, and others which are to be patterned on the conductor film 24 by conventional lithography. In this patterning, although the gate electrodes G1 and G2 formed in the previous step are covered with the second resist film, the third gate electrode G3 is exposed. The second resist film is used as a mask to perform etching by, e.g., RIE, and the first interconnects, contact pads of the gate electrodes, and others are formed on the conductor film 24. In the etching, the third gate electrode G3 which is not covered with the second resist film is simultaneously etched to be removed. Thus, the structure depicted in FIG. 11B is formed in this manner.

Then, like the second embodiment, first and second diffusion layers 34 and 38 serving as a source and drains are formed in the semiconductor substrate 10, and a sidewall insulator 36 is formed on an each side surface of gate electrodes G. Moreover, an interlevel insulator 40 which covers each gate electrode G is formed, and contact plugs 42 are formed in the interlevel insulator 40. Since the source 38S is shared by the two MISFETs Tr1 and Tr2, the two contact plugs 42 on the source 38S as depicted in FIG. 8 do not have to be formed. Therefore, this modification is suitable for miniaturization.

In this manner, the MISFETs of the semiconductor device according to this modification depicted in FIG. 10 are formed.

As explained above, according to this modification, the source region can be formed to be small when patterning each gate electrode G. Additionally, according to this modification, one source can be shared by the two MISFETs and the number of the contact plug with respect to the source is one, thereby providing the structure advantageous in miniaturization. Further, like the second embodiment, the gate electrodes G are formed by using the Levenson mask having the Levenson arrangement. Therefore, it is possible to avoid a variation in current driving characteristics in the MISFETs due to distortion to the gate electrode pattern caused by a difference in transmittance between the 0 region and the $\pi$ region in the Levenson mask.

As explained above, according to the embodiments of the present invention, when using a phase shift mask, e.g., the Levenson mask, to pattern the gate electrodes of the MISFETs, the Levenson arrangement can be automatically provided to the source regions and the drain regions of the MISFETs adjacent to each other. Accordingly, there is provided a semiconductor device in which a variation in current driving characteristics of the MISFETs due to distortion to the gate electrode pattern can be suppressed, and a manufacturing method thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first transistor including a first gate electrode provided above a semiconductor substrate, and a first source and a first drain provided in the semiconductor substrate disposing the first gate electrode therebetween, wherein the first gate electrode has a first curvature concaving toward the first source or the first drain;
   a second transistor arranged to be adjacent to the first transistor, and including a second gate electrode provided above the semiconductor substrate in parallel with the first gate electrode, and a second source and a second drain provided in the semiconductor substrate disposing the second gate electrode therebetween, wherein the second gate electrode has the first curvature; and
   a third gate electrode provided between the first transistor and the second transistor in parallel with the first and second gate electrodes, wherein the third gate electrode has a second curvature concaving toward an opposite direction to the first curvature,
   wherein the first transistor and the second transistor have the same current driving force.

2. The device according to claim 1, wherein the source and the drain of each of the first transistor and the second transistor are alternately arranged with each one gate electrode being interposed therebetween.

3. The device according to claim 2, wherein the third gate electrode electrically separates the first drain and the second source arranged to be adjacent to each other.

4. The device according to claim 1, wherein the first and second sources correspond to a first phase region of a phase shift mask, and the first and second drains correspond to a second phase region of the phase shift mask, wherein a second phase is opposite to a first phase.

5. The device according to claim 4, wherein the phase shift mask is a Levenson mask.

* * * * *